United States Patent [19]

Steenhof

[11] Patent Number: 5,018,172
[45] Date of Patent: May 21, 1991

[54] CHARGE-COUPLED SPS MEMORY DEVICE

[75] Inventor: Frits A. Steenhof, Eindhoven, Netherlands

[73] Assignee: U.S. Philips Corp., New York, N.Y.

[21] Appl. No.: 489,406

[22] Filed: Mar. 5, 1990

[30] Foreign Application Priority Data

Mar. 6, 1989 [NL] Netherlands ................. 8900540

[51] Int. Cl.$^5$ .................. G11C 19/28; G11C 11/34; H01L 29/78
[52] U.S. Cl. ........................... 377/60; 357/24; 365/183
[58] Field of Search ............... 357/24; 365/183; 377/57-63

[56] References Cited

U.S. PATENT DOCUMENTS

| 3,913,077 | 10/1975 | Erb | 357/24 |
| 4,092,734 | 5/1978 | Collins et al. | 357/24 |
| 4,117,546 | 9/1978 | Anantha et al. | 357/24 |
| 4,216,386 | 8/1980 | Boettcher | 357/24 |

Primary Examiner—Gene M. Munson
Attorney, Agent, or Firm—Steven R. Biren

[57] ABSTRACT

In a charge-coupled SPS memory device, in which the transport takes place according to the "pushing" principle, it may occur that during the SP transport charge is injected into the substrate and diffuses via the substrate into the memory mat. In order to avoid this undesired injection of charge, the input is provided with means by which it is ensured that the storage site under the input gate is entirely empty during the SP transport.

5 Claims, 3 Drawing Sheets

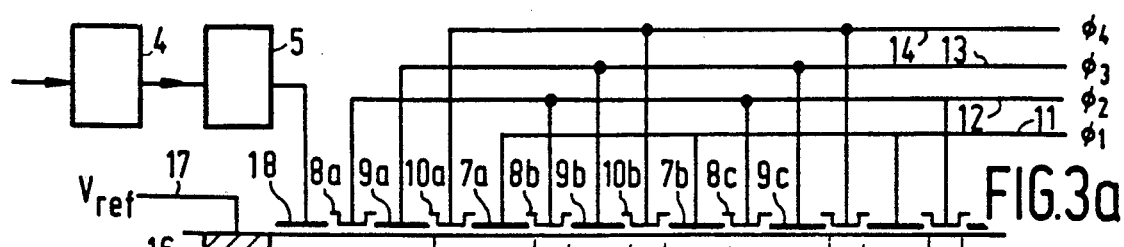
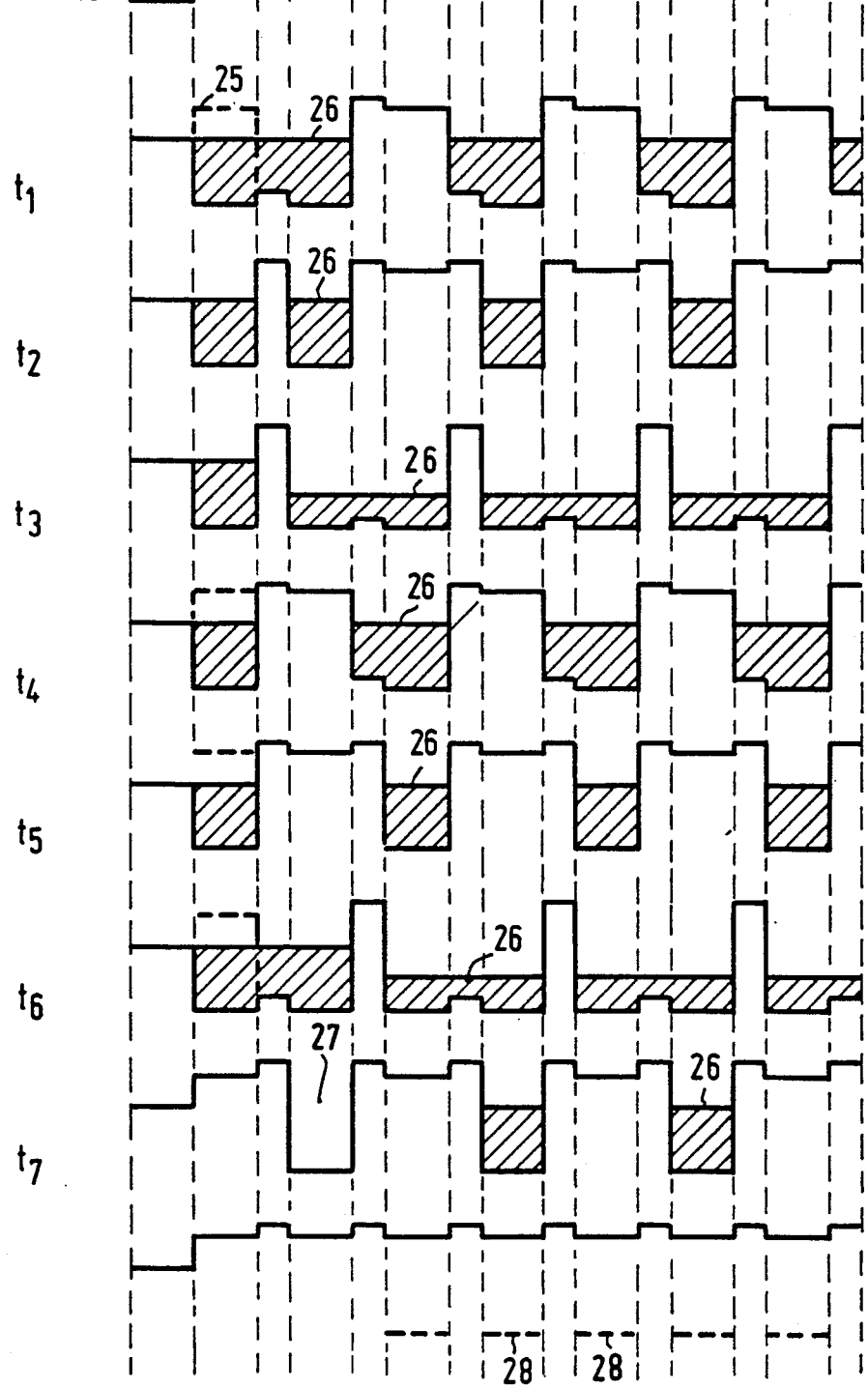

CHARGE-COUPLED SPS MEMORY DEVICE

BACKGROUND OF THE INVENTION

The invention relates to a semiconductor device having a charge-coupled memory device of the SPS type formed at a surface of a semiconductor body and including

- a series input register comprising a series of charge storage sites, in which data can be stored in the form of charge packets,
- a parallel section coupled to the series input register and comprising a number of adjacent parallel registers, which each correspond to one of the storage sites of the series input register,
- a system of clock electrodes, which are connected via clock lines to clock voltage sources for applying clock voltages having a first level at which the semiconductor body has induced in it a potential well, in which charge can be stored, and a second level through which charge is pushed to an adjacent storage site
- an input stage in series with the series input register comprising an input diode and a sampling electrode, which is located between the diode and the first storage site of the series input register and is connected via one of the clock lines to other clock electrodes of the series input register and by means of which in the semiconductor body a potential well can be induced, in which by means of the input diode charge packets can be formed, which are representative of the data supplied
- signal supply means for supplying data which are converted into charge packets by the input stage.

Devices of this type are known, for example, from Chapter 4 "Application of CCD's to Memories" by Kosonocky and Zaininger, published in the book "Charge-Coupled Devices and Systems", edited by Howes and Morgan (John Wiley and Sons, New York 1980). A possible application of CCD memories is described inter alia in the article "A digital field memory for television receivers" by Pelgrom et al, published in I.E.E.E. Transactions on Consumer Electronics, Vol. CE-29, No. 3, August 1983, pp. 242/248. This article discloses a memory, in which video signals of one T.V. picture, after having been 8-bit encoded, are read in serially into the input register and are read out again serially at the output of the output register.

It is already indicated in the aforementioned book of Howes and Morgan that clock voltages can be used at which the voltage at an electrode under which charge has been stored is reduced, as a result of which the potential well under this electrode becomes less deep and the charge is transported to an adjacent storage site. Because of the pushing effect occurring during this charge transport, this mode of operation is often designated as "push clocking". Besides this method, also the so-called "drop clocking" method is known, in which charge stored under a first electrode is transported by increasing the voltage at an adjacent electrode, as a result of which a deeper potential well is formed under the adjacent electrode.

Due to the fact that the storage capacity is not determined, as in the "drop clocking" method, by inner potential barriers, the charge storage capacity in the "push clocking" method can be higher. The signal to be read in can be supplied to the input diode or to a separate signal electrode located between the sampling electrode and the input diode. During reading-in, a charge packet is formed under the sampling electrode, which packet is a measure for the data read in. With binary data, this charge can be a quantity q for a "1" and a zero charge for the signal "0". After reading-in, this charge can be transported through the input register by means of the "push clocking" method described above and, when the input register is full, it can be transferred to the parallel section.

It has been found that, when reading out supplied data in the "push clocking" method described here, distortion of the signals often occurs. Further examinations have shown that this distortion is strongest with data transported via parallel registers located closest to the input.

SUMMARY OF THE INVENTION

The invention has inter alia for its object to provide an SPS memory to be operated by means of "push clocking", in which data can be stored at least substantially without distortion.

As will be explained more fully hereinafter, the invention is based inter alia on the recognition of the fact that this distortion can be avoided in that it is ensured that during the series-parallel transport the charge storage site under the sampling electrode is empty.

A semiconductor device according to the invention is characterized in that an interrupter stage is provided for interrupting the supply of the data in the potential well under the sampling electrode when the series input register is full at such an instant that during the transport of the charge packets from the series input register to the parallel section the part of the semiconductor body under the sampling electrode is free from information representing charge packets.

By means of the interrupter stage, it can be achieved that the charge well under the sampling electrode is empty when the series input register is filled with data. As has been indicated already above, with "push clocking" the charge is pushed away at least in part. During the normal series transport, the charge thus pushed away is collected in the storage site succeeding the storage site from which it is pushed away. During the series-parallel transition, the charge stored in the storage sites in the series input register is transported in an analogous manner to the parallel section. Due to the fact that the sampling electrode is also connected to the clock lines of the series input register—which is advantageous because as a result an additional clock can be economized—in the absence of the interrupter stage charge can be stored also under the sampling electrode when the series input register is filled. During the series-parallel transport, this charge can be pushed into the substrate due to the "push clocking" and can be added via the substrate to charge packets stored in adjacent storage sites. When in the device according to the invention the supply of charge to the storage site under the sampling electrode is interrupted in time, the said signal degradation in the memory can be substantially entirely avoided.

This supply of charge may be interrupted, for example, by applying a cut-off voltage to the input diode just before the series-parallel transition.

A preferred embodiment is characterized in that the interrupter stage forms part of the signal supply means.

BRIEF DESCRIPTION OF THE DRAWING

The invention will be described more fully with reference to an embodiment and the accompanying diagrammatic drawing, in which:

FIG. 3a is a sectional view taken on the line III—III in FIG. 2 of the series input register;

FIG. 3b shows potential profiles in the part shown in FIG. 3a at different instants;

DESCRIPTION OF THE PREFERRED EMBODIMENT

Figure 1:
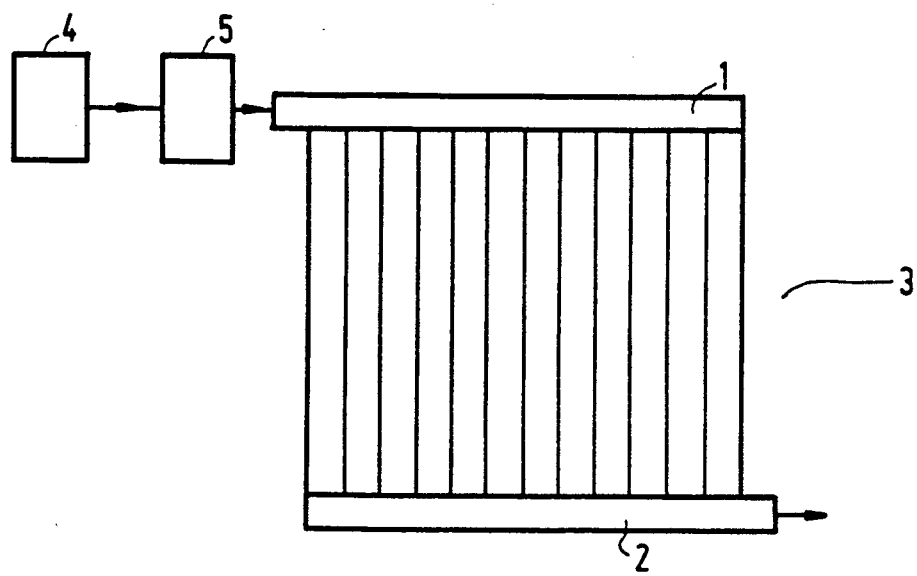
FIG. 1 shows the block circuit diagram of an SPS memory according to the invention.

The SPS memory whose block circuit diagram is shown in FIG. 1 comprises a known series input register 1, a series output register 2 and a parallel section 3, which is located between the series input register and the series output register and forms the actual memory mat. The series input register 1 and the series output register 2 are constituted by charge-coupled devices with charge transport in the horizontal direction, in this embodiment from left to right. The parallel section comprises a number of adjacent charge-coupled devices with charge transport in vertical direction, from the input register 1 to the output register 2.

The manner in which such a memory is operated is well known. The data are first read in serially into the input register. When this register is full, the data are transferred in parallel to the parallel section 3 and are transported in parallel downwards. When the first row of storage or memory sites in the parallel section is empty again, a next row of data can be introduced into the parallel section and be transported further. In this manner, the whole parallel section can be filled with data. For reading-out, the data in the lowermost row of memory sites in the parallel section are transferred in parallel from the parallel section 3 to the horizontal output register 2 and are serially read out at the output of this register.

This simple mode of operation applies to embodiments in which each storage site in the horizontal registers 1 and 2 corresponds to a single vertical register of the parallel section. Frequently, SPS memories are designed so that two adjacent vertical registers of the parallel section correspond to each storage site of the horizontal registers 1 and 2. Such a construction requires a slightly more complicated procedure for reading in and reading out. When reading in the uppermost row of the parallel section first the odd-numbered parallel registers 1, 3, 5 etc. are filled, after which the uppermost sites in the even-numbered parallel registers are filled via the series input register (interlacing). Reading-out takes place in an analogous manner in two successive steps (de-interlacing). These procedures have been described inter alia in the book of Howes and Morgan.

The data to be introduced originating from a source 4 may consist, for example, of 8-bit encoded T.V. signals and are supplied to the input of the series input register 1 via a circuit 5, which will be described more fully hereinafter.

Figure 2:
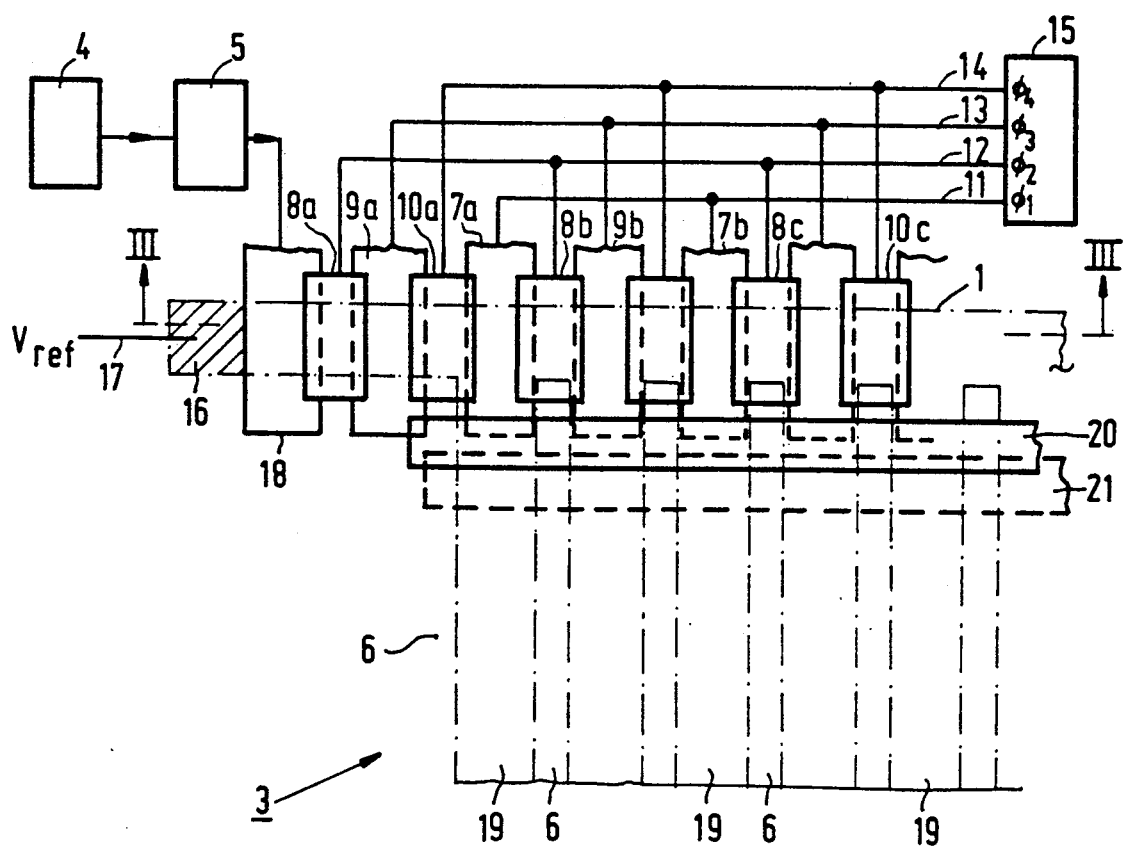
FIG. 2 is a diagrammatic plan view of the series-parallel transition of the SPS memory according to FIG. 1.

FIG. 2 is a plan view of a part of the input register 1 with the input stage and an adjoining part of the parallel section; FIG. 3 is a sectional view of the input register 2.

In FIG. 2, the channels 19 of the charge-coupled device are indicated by dot-and-dash lines. The channel limiting regions 6, which laterally limit the channels (registers) in the semiconductor body, are shown between the channels. The input register 1 is provided with an electrode system 7-10, by means of which the register is operated by way of example as a 4-phase CCD. The electrodes 7, which are distinguished from each other by the reference symbols a, b etc., are connected to the clock line 11, via which the clock $\phi_1$ delivered by the source 15 is supplied. In an analogous manner, the clock $\phi_2$ is applied to the electrodes 8a, b etc. via the clock line 12, while the clocks $\phi_3$ and $\phi_4$ are applied to the electrodes 9 and 10, respectively, via the clock lines 13 and 14, respectively. The input of the register 1 comprises an n+ input diode 16, which is indicated by cross-hatched lines in FIG. 2 and is connected via a connection 17 to a reference voltage Vref. Between the diode and the first clock electrode 8a is arranged an input gate 18, via which the digital input signals delivered by the source 4 (FIG. 1) are supplied.

The electrodes 7-10, 18 are arranged in the usual manner in a two-layer overlapping configuration. The edges of the electrodes in the lowermost layer, which are covered by the electrodes of the uppermost layer, are indicated by broken lines in FIG. 2.

In the parallel section 3, the plan view of FIG. 2 shows five registers 19, which are mutually separated by the channel-limiting regions 6. With reference to the electrode system, by means of which the charge transport in the parallel section is controlled, only the first and second electrodes 20 and 21, respectively, are shown in FIG. 2. The electrode 20 is formed again in the uppermost wiring layer and overlaps the electrodes 7 and 9. The electrode 21 is formed in the lowermost wiring layer and is indicated entirely by broken lines. The remaining clock electrodes above the parallel section are not shown in the drawing, but should be considered as a regular continuation of the electrodes 20/21. Thus, the electrode 21 is followed by an electrode in the uppermost conductor layer followed in turn by an electrode in the lowermost conductor layer, etc.

Figure 4:
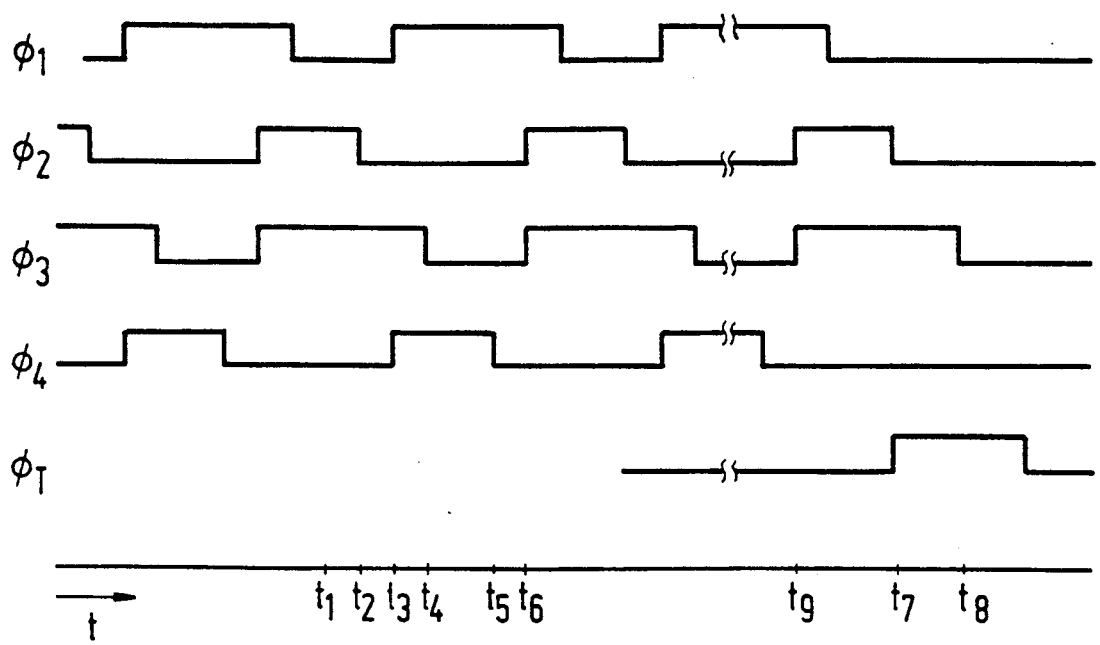
FIG. 4 shows a number of clock voltages to be applied to the device as a function of time.

During reading-in, the information originating from the source 4, for example 8-bit encoded T.V. information, is supplied via the gate 5 to the gate 18 in such a manner that with a logic "1" the semiconductor region under the gate 18 is conducting and with a logic "0" this region is non-conducting. The signals pass, when filling the input register 1, through the circuit 5 without being impaired. The 4-phase clocks $\phi_1$, $\phi_2$, $\phi_3$ and $\phi_4$ are shown in FIG. 4 as a function of time. FIG. 3b shows the potential profiles occurring in the part shown in FIG. 3a at the instants t1–t8. The input diode 16 then remains at the fixed level Vref.

At t1, $\phi_2$ and $\phi_3$ are high, as a result of which potential wells are formed under the storage electrodes 9a, 9b, 9c. In these potential wells, charge packets are stored in dependence upon the data stored, which is shown diagrammatically in FIG. 3b by cross-hatched lines. Due to the fact that $\phi_2$ is also high, the potential level under the gate 8a is high too (the positive potential is plotted in downward direction in a usual manner). When a "1" is supplied to the gate 18, charge can flow into the well under the gate 9a. In the case in which the information to be introduced is a "0", a low voltage is supplied to the gate 18, as a result of which a potential barrier 25 is formed under the gate 18, which potential barrier is indicated by broken lines and prevents charge from flowing from the zone 16 to the well under the gate 9a. At the instant t2, $\phi_2$ passes to the low voltage level. The charge packet 26 under the electrode 9a is then separated from the input diode 16. At the same time, the charge under the gates 8b and 8c is pushed under the gates 9b and 9c, respectively. At t3, $\phi_1$ and $\phi_4$ both pass to the positive voltage level, as a result of which the charge packets can extend under the gates 9a, 10a, 7a; 9b, 10b, 7b; 9c, 10c, 7c, etc. Subsequently, (t4) the voltage $\phi_3$ is reduced, as a result of which the charge under the gates 9a, 9b, 9c is pushed to the right into the potential wells under the gates 10a, 7a; 10b, 7b; 10c, 7c, etc. At t5, $\phi_4$ again passes to the low voltage level, as a result of which the charge packets are stored entirely under the storage gates 7a, 7b, 7c. At the instant t6, $\phi_2$ and $\phi_3$ again pass to the positive voltage level, as a result of which wide potential wells are formed again in the charge transport channel. At the same time, depending upon the information supplied, a fresh charge packet can be formed under the gate 9a, which packet can then be transported to the right in the manner described here. When the input register has been filled, the data stored under the gates 9b, 9c etc. must be transferred to the parallel section. As a result, it is ensured in the first place that the potential well 27 under the input gate 9a, which is clocked simultaneously with the gates 9b and 9c, does not contain any charge. At the instant t7, the clock $\phi_T$ applied to the transfer gate 20 passes to the high voltage level. The high voltage is also applied to the first storage gate 21 of the parallel section, as a result of which potential wells are induced under the gate 21. FIG. 3b indicates the potential wells under the gate 21 in broken lines 28. At t8, $\phi_3$ passes to the low level. The charge packets 26 are pushed away from under the electrodes 9b, 9c into the potential wells under the gates 20, 21 of the parallel section. If at the instants t7 and t8 charge should also be stored under the input gate 9a, this charge would be injected during the series-parallel transport into the silicon substrate and could arrive by diffusion in part at data in the parallel section, as a result of which degradation of the information stored would occur. However, when according to the invention it is ensured that the potential well 27 is empty during the series-parallel transport, this degradation of the information stored is avoided.

Figure 5:
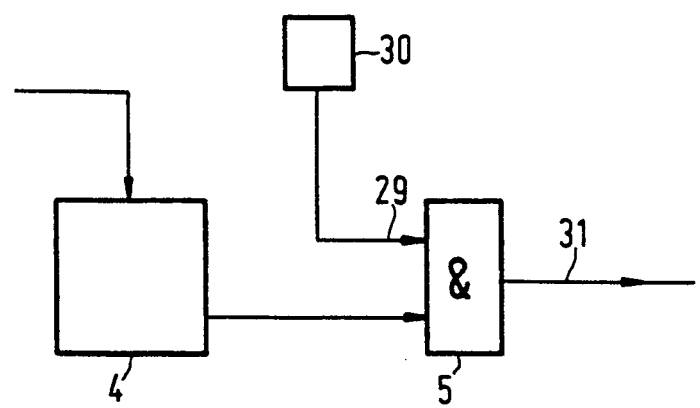
FIG. 5 shows the block circuit diagram of an embodiment of the data interrupter stage of the device.

The supply of charge from the zone 16 can be interrupted in different ways. For example, it is possible to increase the potential of the input diode 16 in time, that is to say just before t9 when $\phi_3$ is low. Another manner is shown diagrammatically in FIG. 5. The digital signals, which are delivered by the signal source 4, are transmitted to an AND gate 5. A second input 29 of the AND gate 5 is connected to a control circuit 30, which in turn can be controlled by the clock (not shown) of the memory. In the period in which data must be supplied, the circuit delivers a signal "1" so that the data from the source 4 pass through the AND gate 5 without being impaired. When the flow of data must be interrupted, the circuit 30 delivers the signal "0", as a result of which the output 31 of the AND gate 5, which is connected to the input electrode 18, is permanently empty.

It will be appreciated that the invention is not limited to the embodiments given here, but that within the scope of the invention many further variations are possible. For example the supply of charge to the input gate may also be interrupted by temporarily applying a higher voltage to the input diode.

Clock voltages other than those shown in FIG. 4 may also be used. In this connection, it should be noted that the clock voltages $\phi_1$, $\phi_2$, $\phi_3$ and $\phi_4$ shown in FIG. 4 offer particular advantages and may therefore be used advantageously also in CCD's other than the charge-coupled device described here. Due to the fact that the clocks $\phi_1$ and $\phi_3$, which are applied to the storage electrodes, overlap each other, there will also be at least one storage electrode available for the charge. Due to the fact that the trailing edges of the clocks $\phi_1$, $\phi_2$, $\phi_3$ and $\phi_4$ succeed each other in time, it is possible to utilize the pushing effect, by which the charge is pushed away under one electrode. The instants of the trailing edges are chosen so that the time duration between the trailing edges of $\phi_1$ and $\phi_2$ and between the trailing edges of $\phi_3$ and $\phi_4$ (for example the time duration t4–t5) is maximal. As a result, for the charge packets, when stored under the charge storage electrodes having the largest surface area the longest time period is available for the transport to a next storage site. The leading edges of the clocks are chosen so that, viewed in time, they also succeed each other or at least are coincident. Thus, it is avoided that during the transport charge carriers fall over a potential barrier into a potential well. If this condition is not satisfied, hot electron multiplication often occurs, which may result in degradation of the information stored.

I claim:

1. A semiconductor device having a charge-coupled memory device of the SPS type formed at a surface of a semiconductor body and comprising:
    a series input register comprising a series of charge storage sites, in which data can be stored in the form of charge packets;
    a parallel section coupled to the series input register and comprising a plurality of adjacent parallel registers, each of which corresponds to one of the storage sites of the series input register;
    a system of clock electrodes, which are connected by clock lines to clock voltage sources for applying clock voltages having a first level at which the semiconductor body has induced in it a potential well, in which charge can be stored, and a second level through which charge is pushed to an adjacent storage site;
    an input stage in series with the series input register comprising an input diode and a sampling electrode, which is located between the diode and the first storage site of the series input register and is connected by one of the clock lines to other clock electrodes of the series input register and by means of which a potential well can be induced in the semiconductor body, in which by means of the input diode charge packets can be formed, which are representative of the data supply; and
    signal supply means for supplying data which are converted into charge packets by the input stage, characterized in that an interrupter stage is provided for interrupting the supply of the data in the potential well under the sampling electrode when the series input register is full at such an instant that during the transport of the charge packets from the series input register to the parallel section the part of the semiconductor body under the sampling electrode is free from information-representing charge packets.

2. A semiconductor device as claimed in claim 1, characterized in that the interrupter stage forms part of the signal supply means.

3. A semiconductor device as claimed in claim 1 or 2, characterized in that an electrode is arranged between the sampling gate and the input diode, which electrode is a data supply electrode and is connected to said signal supply means.

4. A semiconductor device as claimed in claim 2 characterized in that the data contain binary information having two levels, one of which represents a logic "1" and the other of which represents a logic "0", while at one of these levels charge carriers can flow and at the other level charge carriers cannot flow from the input diode to the sampling gate, a voltage corresponding to the said other level being applied to the data supply electrode by means of the interrupter stage.

5. A semiconductor device as claimed in claim 4, characterized in that the interrupter stage comprises a control circuit and a logic AND gate, the control circuit generating on behalf of the interruption of the data supply a signal corresponding to said other level and being supplied to an input of the AND gate, and in that the AND gate has a second input, through which the data are supplied, and an output, which is connected to the data supply electrode.

* * * * *